US009871369B2

(12) United States Patent
Ohki (10) Patent No.: US 9,871,369 B2
(45) Date of Patent: Jan. 16, 2018

(54) LOAD DRIVER CIRCUIT AND LOAD SHORT-CIRCUIT DETECTION CIRCUIT

(71) Applicant: SHINDENGEN ELECTRIC MANUFACTURING CO., LTD., Tokyo (JP)

(72) Inventor: Isao Ohki, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 79 days.

(21) Appl. No.: 15/032,269

(22) PCT Filed: Feb. 23, 2015

(86) PCT No.: PCT/JP2015/054970
§ 371 (c)(1),
(2) Date: Apr. 26, 2016

(87) PCT Pub. No.: WO2016/135815
PCT Pub. Date: Sep. 1, 2016

(65) Prior Publication Data
US 2016/0294178 A1 Oct. 6, 2016

(51) Int. Cl.
*H02B 1/24* (2006.01)
*H02H 3/08* (2006.01)
(Continued)

(52) U.S. Cl.
CPC ............ *H02H 3/08* (2013.01); *G01R 31/025* (2013.01); *G01R 31/40* (2013.01); *H02H 7/222* (2013.01); *H02H 3/087* (2013.01)

(58) Field of Classification Search
None
See application file for complete search history.

(56) References Cited

U.S. PATENT DOCUMENTS 9,544,958 B2 * 1/2017 Ohki .................. H05B 33/0884
2010/0110599 A1 5/2010 Ohshima

FOREIGN PATENT DOCUMENTS

| JP | 2008-283641 A | 11/2008 |
| JP | 2011-166869 A | 8/2011 |
| WO | 2011/096546 A1 | 8/2011 |

OTHER PUBLICATIONS

International Search Report for Application No. PCT/JP15/54970, dated Apr. 21, 2015 (2 pages).
(Continued)

*Primary Examiner* — Cassandra Cox
(74) *Attorney, Agent, or Firm* — Nutter McClennen & Fish LLP; John J. Penny, Jr.

(57) ABSTRACT

A load driver circuit includes a detection circuit periodically detecting an inrush current that flows to the detection capacitor from the first terminal through the first switch element and outputting a detection signal responsive to a result of the detection at the first node; a peak hold circuit holding a peak voltage of the detection signal and outputting the held peak voltage as a detection voltage; a comparison circuit comparing the detection voltage with a threshold voltage and outputting a comparison result signal responsive to a result of the comparison; a control circuit controlling the first switch element to switch on and off, controlling a current detection operation of the detection circuit, and outputting a load control signal that controls the operation of the load; and a logic circuit controlling the load switch element based on the comparison result signal and the load control signal.

15 Claims, 3 Drawing Sheets

(51) Int. Cl.
    *G01R 31/02*     (2006.01)
    *G01R 31/40*     (2014.01)
    *H02H 7/22*     (2006.01)
    *H02H 3/087*     (2006.01)

(56) References Cited

OTHER PUBLICATIONS

International Preliminary Report on Patentability for Application No. PCT/JP2015/054970, dated Sep. 8, 2017 (4 pages).

\* cited by examiner

LOAD DRIVER CIRCUIT AND LOAD SHORT-CIRCUIT DETECTION CIRCUIT

RELATED APPLICATIONS

This present application claims priority under 35 U.S.C. §365 to International Application No. PCT/JP2015/054970, filed on Feb. 23, 2015, the entire contents of which are incorporated herein by reference.

TECHNICAL FIELD

The present invention relates to a load driver circuit and a load short-circuit detection circuit.

BACKGROUND ART

There is a driver circuit that drives a common load, such as a solenoid or a heater. Such a conventional driver circuit includes a switch element and a current detection resistor that are connected in series between the load, which is connected to a battery, and the ground.

When the conventional driver circuit drives the load, the driver circuit turns on the switch element and detects the voltage drop across the current detection resistor. If an overcurrent occurs, the driver circuit turns off the switch element.

SUMMARY OF INVENTION

According to the conventional technique described above, however, when the switch element is turned on, and a state where an overcurrent flows (that is, a short-circuit state of the load) is detected, the overcurrent continues flowing until the switch element is turned off. Thus, there is a problem in that the circuit including the switch element may be damaged by the overcurrent.

An object of the present invention is to provide a load driver circuit and a load short-circuit detection circuit that can detect a short-circuit state of a load and protect a switch element with higher reliability.

A load driver circuit, according to an embodiment of an aspect of the present invention, that controls driving of a load, comprising:

a first terminal to which the load is connected at one end thereof;

a second terminal to which a battery is connected at a negative electrode thereof, the battery being connected to another end of the load at a positive electrode thereof;

a load switch element that has a current path connected to the first terminal at one end thereof and to the second terminal at another end thereof, the load switch element being turned on to supply a current from the battery to the load to drive the load and turned off to interrupt the supply of the current to the load to stop the operation of the load;

a detection circuit comprising a first switch element connected to the first terminal at one end thereof, a detection capacitor connected to another end of the first switch element at one end thereof and to a first node at another end thereof, a detection resistor connected to the first node at one end thereof and to the second terminal at another end thereof, and a discharge resistor connected in parallel with the detection resistor and the detection capacitor between the another end of the first switch element and the second terminal, the discharge resistor being connected to the another end of the first switch element at one end thereof and to the second terminal at another end thereof, the detection circuit periodically detecting an inrush current that flows to the detection capacitor from the first terminal through the first switch element and outputting a detection signal responsive to a result of the detection at the first node;

a peak hold circuit that holds a peak voltage of the detection signal and outputs the held peak voltage as a detection voltage;

a comparison circuit that compares the detection voltage with a threshold voltage and outputs a comparison result signal responsive to a result of the comparison;

a control circuit that controls the first switch element to switch on and off, controls a current detection operation of the detection circuit, and outputs a load control signal that controls the operation of the load; and a logic circuit that controls the load switch element based on the comparison result signal and the load control signal, wherein, when the load control signal indicates to drive the load, the logic circuit turns off the load switch element when the comparison result signal indicates that the detection voltage is equal to or higher than the threshold voltage, and turns on the load switch element when the comparison result signal indicates that the detection voltage is lower than the threshold voltage.

In the load driver circuit, wherein when the load control signal indicates to stop the operation of the load, the logic circuit turns off the load switch element.

In the load driver circuit, wherein the control circuit controls the first switch element to periodically switch on and off, and the detection circuit outputs the detection signal at the first node.

In the load driver circuit, wherein the detection circuit further comprises:

a second switch element connected in series with the discharge resistor between the another end of the first switch element and the second terminal, and the control circuit controls the second switch element to switch off when the control circuit turns on the first switch element, and controls the second switch element to switch on when the control circuit turns off the first switch element.

In the load driver circuit, wherein the peak hold circuit outputs the held peak voltage as the detection voltage at the second node.

In the load driver circuit, wherein the peak hold circuit comprises:

a holding diode that is connected to the first node at an anode thereof and to the second node at a cathode thereof; and a holding capacitor that is connected between the second node and the second terminal.

In the load driver circuit, wherein the comparison circuit comprises:

a voltage divider circuit that outputs a divided voltage as the threshold voltage, the divided voltage being obtained by dividing a voltage between the third terminal and the second terminal; and a comparator that receives the detection voltage and the threshold voltage, compares the detection voltage with the threshold voltage, and outputs the comparison result signal in response to a result of the comparison.

In the load driver circuit, wherein the voltage divider circuit comprises:

a first voltage divider resistor that is connected to the third terminal at one end thereof and to a voltage dividing node at another end thereof; and a second voltage divider resistor that is connected to the voltage dividing node at one end thereof and to the second terminal at another end thereof, and the voltage divider circuit outputs a voltage at the voltage dividing node as the threshold voltage.

In the load driver circuit, wherein the threshold voltage is set to be lower than the detection voltage, which is the peak voltage of the detection signal that is output from the detection circuit as a result of the control circuit periodically turning on and off the first switch element, in a state where the load is short-circuited.

In the load driver circuit, wherein the threshold voltage is set to be higher than the detection voltage, which is the peak voltage of the detection signal that is output from the detection circuit as a result of the control circuit periodically turning on and off the first switch element, in a state where the load is not short-circuited.

In the load driver circuit, wherein the logic circuit comprises:

an inverter that is connected to an output of the comparator at an input thereof and receives the comparison result signal; and an AND circuit that receives an output signal of the inverter and the load control signal and outputs, as a signal that controls the load switch element, a signal obtained by logical OR operation of the output signal of the inverter and the load control signal.

In the load driver circuit, wherein the load is a servomotor, a solenoid, a lamp or a heater.

In the load driver circuit, wherein the detection capacitor has a capacitance greater than a capacitance of the holding capacitor.

In the load driver circuit, wherein the first switch element is a pMOS transistor that is connected to the first terminal at a source thereof and to the one end of the detection capacitor at a drain thereof and has a gate voltage controlled by the control circuit.

A load short-circuit detection circuit, according to an embodiment of an aspect of the present invention, that detects a short-circuit state of a load, comprising:

a first terminal to which the load is connected at one end thereof;

a second terminal to which a battery is connected at a negative electrode thereof, the battery being connected to another end of the load at a positive electrode thereof;

a load switch element that has a current path connected to the first terminal at one end thereof and to the second terminal at another end thereof, the load switch element being turned on to supply a current from the battery to the load to drive the load and turned off to interrupt the supply of the current to the load to stop the operation of the load;

a detection circuit comprising a first switch element connected to the first terminal at one end thereof, a detection capacitor connected to another end of the first switch element at one end thereof and to a first node at another end thereof, a detection resistor connected to the first node at one end thereof and to the second terminal at another end thereof, and a discharge resistor connected in parallel with the detection resistor and the detection capacitor between the another end of the first switch element and the second terminal, the discharge resistor being connected to the another end of the first switch element at one end thereof and to the second terminal at another end thereof, the detection circuit periodically detecting an inrush current that flows to the detection capacitor from the first terminal through the first switch element and outputting a detection signal responsive to a result of the detection at the first node;

a peak hold circuit that holds a peak voltage of the detection signal and outputs the held peak voltage as a detection voltage; and a comparison circuit that compares the detection voltage with a threshold voltage and outputs a comparison result signal responsive to a result of the comparison.

A load driver circuit according to an aspect of the present invention is a load driver circuit that controls driving of a load, including: a first terminal to which the load is connected at one end thereof; a second terminal to which a battery is connected at a negative electrode thereof, the battery being connected to another end of the load at a positive electrode thereof; a load switch element that has a current path connected to the first terminal at one end thereof and to the second terminal at another end thereof, the load switch element being turned on to supply a current from the battery to the load to drive the load and turned off to interrupt the supply of the current to the load to stop the operation of the load; a detection circuit comprising a first switch element connected to the first terminal at one end thereof, a detection capacitor connected to another end of the first switch element at one end thereof and to a first node at another end thereof, a detection resistor connected to the first node at one end thereof and to the second terminal at another end thereof, and a discharge resistor connected in parallel with the detection resistor and the detection capacitor between the another end of the first switch element and the second terminal, the discharge resistor being connected to the another end of the first switch element at one thereof and to the second terminal at a another end thereof, the detection circuit periodically detecting an inrush current that flows to the detection capacitor from the first terminal through the first switch element and outputting a detection signal responsive to a result of the detection at the first node; a peak hold circuit that holds a peak voltage of the detection signal and outputs the held peak voltage as a detection voltage; a comparison circuit that compares the detection voltage with a threshold voltage and outputs a comparison result signal responsive to a result of the comparison; a control circuit that outputs a pulse signal for the current detection operation of the detection circuit and a load control signal for controlling the operation of the load; and a logic circuit that controls the load switch element based on the comparison result signal and the load control signal.

When the load control signal indicates to drive the load, if the comparison result signal indicates that the detection voltage is equal to or higher than the threshold, the logic circuit determines that the load is short-circuited, and turns off the load switch element.

On the other hand, when the load control signal indicates to drive the load, if the comparison result signal indicates that the detection voltage is lower than the threshold, the logic circuit determines that the load is not short-circuited, and turns on the load switch element.

In this way, even when the load switch element for driving the load is in the off state (that is, when the load is not operating), the short-circuit state of the load can be detected. If the short-circuit state of the load is detected, the load switch element is turned off (or prevented from being turned on). Therefore, an overcurrent can be prevented from flowing to the load switch element.

That is, the load driver circuit according to the present invention can detect the short-circuit state of the load and protect the switch element with higher reliability.

DESCRIPTION OF EMBODIMENTS

In the following, embodiments of the present invention will be described with reference to the drawings.

First Embodiment

A load driver system 1000 according to a first embodiment (FIG. 1) includes a battery "B", a load "Load" connected to the battery "B", and a load driver circuit 100 that controls driving of the load "Load".

Figure 1:
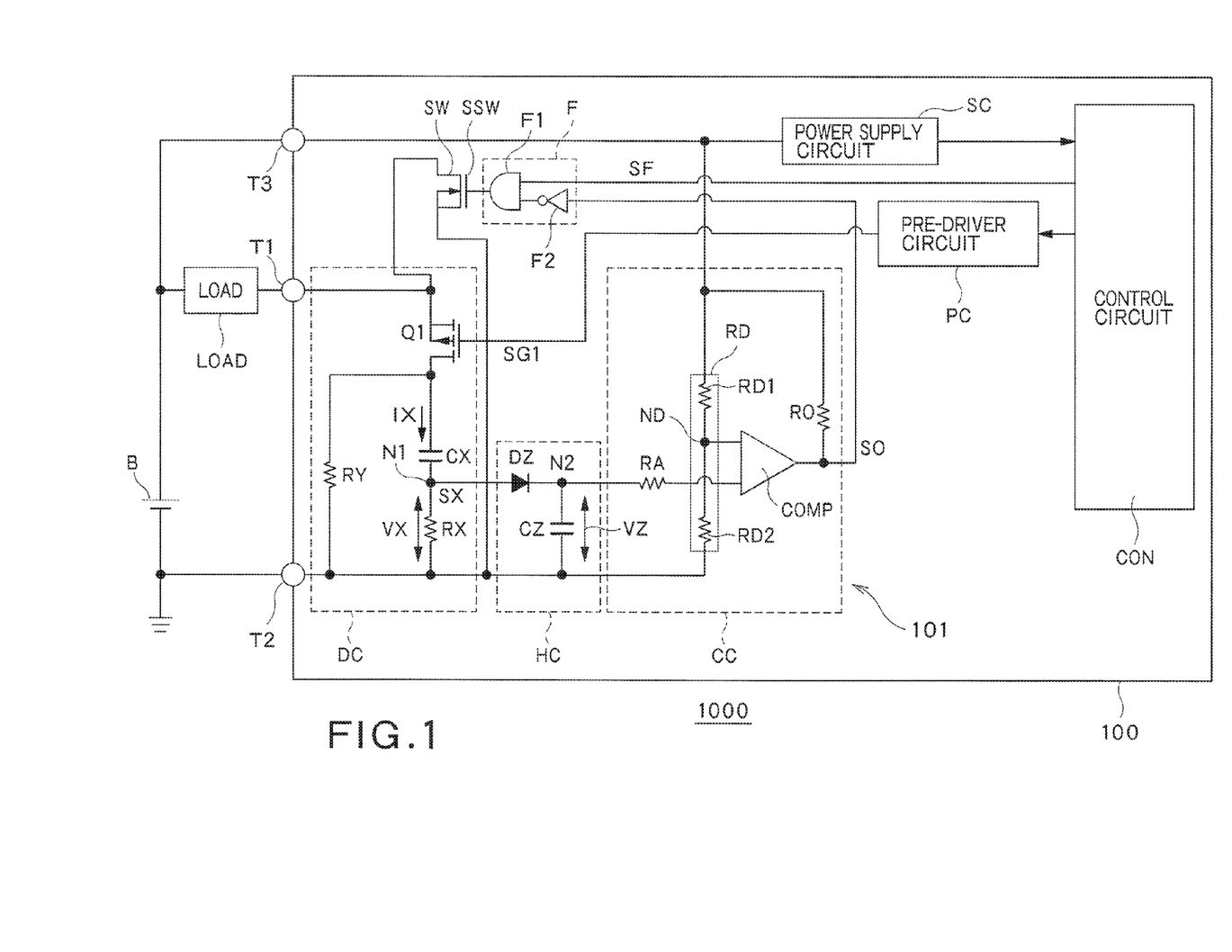
FIG. 1 is a diagram showing an example of a configuration of a load driver system 1000 according to a first embodiment.

The load driver system 1000 is mounted on a motorcycle, for example. The load "Load" is a servomotor, a solenoid, a lamp or a heater on the motorcycle, for example.

A condition in which the load "Load" is short-circuited can occur as the mechanism around the load "Load" operates (changes), for example. Once the load "Load" is short-circuited, a short-circuit current (an overcurrent) flows from a positive electrode of the battery "B" to a first terminal "T1". However, the load "Load" returns to the normal state when the mechanism around the load "Load" returns to the original state, for example.

The load driver circuit 100 includes the first terminal "T1" to which the load "Load" is connected at one end thereof, a second terminal "T2" to which the battery "B" is connected at a negative electrode thereof, and a third terminal "T3" that is connected to the positive electrode of the battery "B" (FIG. 1). The battery "B" is connected to another end of the load "Load" at the positive electrode thereof. In the example shown in FIG. 1, the second terminal "T2" is grounded.

The load driver circuit 100 further includes a load switch element "SW" having a current path that is connected to the first terminal "T1" at one end thereof and to the second terminal "T2" at another end thereof.

When the load switch element "SW" is turned on, a current flows from the battery "B" to the load "Load" to drive the load "Load". On the other hand, when the load switch element "SW" is turned off, the current to the load "Load" is interrupted, and the load "Load" stops operating.

In the example shown in FIG. 1, the load switch element "SW" is an nMOS transistor that is connected to the first terminal "T1" at a drain thereof and to the second terminal "T2" at a source thereof and has a gate voltage controlled by a signal "SSW".

The load driver circuit 100 further includes a detection circuit "DC" that periodically detects an inrush current flowing to a detection capacitor "CX" from the first terminal "T1" through a first switch element "Q1" and outputs a detection signal "SX" responsive to the detection result at a first node "N1".

The load driver circuit 100 further includes a peak hold circuit "HC" that holds a peak voltage of the detection signal "SX" and outputs the held peak voltage as a detection voltage "VZ" at a second node "N2". The load driver circuit 100 further includes a comparison circuit "CC" that compares the detection voltage "VZ" responsive to the detection signal "SX" with a threshold voltage "Vth" and outputs a comparison result signal "SO" responsive to the comparison result.

The detection circuit "DC", the comparison circuit "CC" and the peak hold circuit "HC" form a load short-circuit detection circuit 101 that detects a short circuit of the load "Load".

The load driver circuit 100 further includes a control circuit "CON" that controls the current detection operation of the detection circuit "DC" and outputs a load control signal "SF" that controls operation of the load "Load".

The load driver circuit 100 further includes a power supply circuit "SC" that is connected to the third terminal "T3" and supplies electric power to the control circuit "CON" based on a current input from the third terminal "T3".

The load driver circuit 100 further includes a logic circuit "F" that controls the load switch element "SW" based on the comparison result signal "SO" and the load control signal "SF".

In the example shown in FIG. 1, the detection circuit "DC" includes the first switch element "Q1" that is connected to the first terminal "T1" at one end thereof and is turned on and off under the control of the control circuit "CON" and the detection capacitor "CX" that is connected to another end of the first switch element "Q1" at one end thereof and to the first node "N1" at another end thereof.

The detection circuit "DC" further includes a detection resistor "RX" that is connected to the first node "N1" at one end thereof and to the second terminal "T2" at another end thereof and a discharge resistor "RY" that is connected to the another end of the first switch element "Q1" at one end thereof and to the second terminal "T2" at another end thereof.

The first switch element "Q1" is a pMOS transistor that is connected to the first terminal "T1" at a source thereof and to the one end of the detection capacitor "CX" at a drain thereof. A gate voltage of the pMOS transistor is controlled by a control signal output from the control signal "CON" (a gate signal "SG1" output from a pre-driver circuit "PC"). That is, the pMOS transistor is turned on and off under the control of the gate signal "SG1".

The detection resistor "RX" is a resistor for detecting a current "IX" flowing to the detection capacitor "CX".

The discharge resistor "RY" is connected in parallel with the detection resistor "RX" and the detection capacitor "CX" between the another end of the first switch element "Q1" and the second terminal "T2". The discharge resistor "RY" is a resistor for discharging the detection capacitor "CX".

The detection circuit "DC" configured as described above outputs the detection signal "SX" at the first node "N1". That is, the detection signal "SX" is the voltage at the first node "N1".

If the first switch element "Q1" is turned on when the load "Load" is normally operating and the drive current is flowing (that is, when the load "Load" is not short-circuited) or when the load "Load" is short-circuited and a short-circuit current is flowing (that is, when a current is flowing from the first terminal "T1"), for example, the current "IX" flows from the first terminal "T1" to the detection capacitor "CX", and the detection capacitor "CX" is charged.

If the first switch element "Q1" is then turned off, the detection capacitor "CX" is discharged through the discharge resistor "RY".

If the first switch element "Q1" is turned on when no current is flowing from the first terminal "T1" (that is, when the load is open), the current "IX" does not flow from the first terminal "T1" to the detection capacitor "CX", and the detection capacitor "CX" is not charged.

As described above, the peak hold circuit "HC" holds the peak voltage of the detection signal "SX" and outputs the held peak voltage as the detection voltage "VZ" at the second node "N2".

As shown in FIG. 1, for example, the peak hold circuit "HC" includes a holding diode "DZ" that is connected to the first node "N1" at an anode thereof and to the second node "N2" at a cathode thereof, and a holding capacitor "CZ" that is connected between the second node "N2" and the second terminal "T2".

The capacitance of the detection capacitor "CX" described above is set to be greater than the capacitance of the holding capacitor "CZ".

A peak of the voltage of the detection signal "SX" (a voltage "VX" between the opposite ends of the detection resistor "RX") is held in the holding capacitor "CZ" via the holding diode "DZ".

When the load "Load" is in the short-circuit state, for example, the voltage "VZ" between the opposite ends of the holding capacitor "CZ" is approximately equal to the voltage of the battery "B".

On the other hand, when the load "Load" is normally operating and the drive current is flowing, the voltage "VZ" between the opposite ends of the holding capacitor "CZ" is reduced to be close to 0 V, since the current "IX" flowing to the detection capacitor "CX" is low.

As described above, the comparison circuit "CC" compares the detection voltage "VZ" responsive to the detection signal "SX" with the threshold voltage "Vth" and outputs the comparison result signal "So" responsive to the comparison result.

For example, the comparison circuit "CC" compares the detection voltage "VZ" with the threshold voltage "Vth", and outputs a comparison result signal "SO" at a "High" level if the detection voltage "VZ" is equal to or higher than the threshold voltage "Vth". On the other hand, if the comparison circuit "CC" compares the detection voltage "VZ" with the threshold voltage "Vth", and the detection voltage "VZ" is lower than the threshold voltage "Vth", the comparison circuit "CC" outputs a comparison result signal "SO" at a "Low" level.

For example, as shown in FIG. 1, the comparison circuit "CC" includes a voltage divider circuit "RD" that divides the voltage between the first terminal "T1" and the third terminal "T3" and outputs the divided voltage as the threshold voltage "Vth", and a comparator "COMP" that receives the detection voltage "VZ" and the threshold voltage "Vth" thereto, compares the detection voltage "VZ" with the threshold voltage "Vth" and outputs the comparison result signal "SO" responsive to the comparison result.

As shown in FIG. 1, the voltage divider circuit "RD" includes a first voltage dividing resistor "RD1" that is connected to the third terminal "T3" at one end thereof and to a voltage dividing node "ND" at another end, and a second voltage dividing resistor "RD2" that is connected to the voltage dividing node "ND" at one end and to the second terminal "T2" at another end thereof.

The voltage divider circuit "RD" outputs a voltage at the voltage dividing node "ND" as the threshold voltage "Vth".

The comparison circuit "CC" further includes an output resistor "Ro" that is connected between the third terminal "T3" and an output of the comparator "COMP", and a protective resistor "RA" that is connected between the second node "N2" and an input of the comparator "COMP".

Although the comparison circuit "CC" shown in FIG. 1 is formed with the comparator "COMP", the comparison circuit "CC" may be formed with other circuit components capable of comparing the voltages, such as a transistor.

As described above, the control circuit "CON" controls the current detection operation of the detection circuit "DC" and outputs the load control signal "SF" that controls operation of the load "Load".

The control circuit "CON" controls the first switch element "Q1" to periodically switch on and off.

The threshold voltage "Vth" is set to be higher than the detection voltage "VZ", which is the peak voltage of the detection signal "SX" that is output from the detection circuit "DC" as a result of the control circuit "CON" periodically turning on and off the first switch element "Q1", in the normal state where the load "Load" is not short-circuited, for example.

Thus, if the comparison result signal "SO" indicates that the detection "VZ" is equal to or higher than the threshold voltage "Vth", the control circuit "CON" can determine that the load "Load" is not short-circuited.

Furthermore, the threshold voltage "Vth" is set to be lower than the detection voltage "VZ", which is the peak voltage of the detection signal "SX" that is output from the detection circuit "DC" as a result of the control circuit "CON" periodically turning on and off the first switch element "Q1", in the short-circuit state where the load "Load" is not short-circuited.

Thus, if the comparison result signal "SO" indicates that the detection voltage "VZ" is lower than the threshold voltage "Vth", the control circuit "CON" can determine that the load "Load" is short-circuited.

The load driver circuit 100 includes the pre-driver circuit "PC" that controls the gate signal "SG1" of the pMOS transistor (that is, drives the first switch element "Q1") in response to a control signal for controlling the first switch element "Q1" output from the control circuit "CON".

For example, the control circuit "CON" outputs a pulse signal to the pre-driver circuit "PC" to periodically switch the first switch element "Q1" in the detection circuit "DC".

The pulse signal preferably has a frequency of 10 to 200 Hz and an on-duty of approximately 1% to 10%. That is, the frequency of the switching of the first switch element "Q1" by the control circuit "CON" is 10 to 200 Hz, and the on-duty of the first switch element "Q1" is approximately 1% to 10%.

The pre-driver circuit "PC" may be omitted. That is, the control circuit "CON" may output the gate signal "SG1" by itself to control the first switch element "Q1".

As described above, in order to detect the on/off state of the load "Load" with higher reliability, the load driver circuit 100 includes the peak hold circuit "HC". However, for example, if the load driver circuit 100 can detect whether the load "Load" is in the normal state or the short-circuit state based on whether a pulse signal is fed back or not, the peak hold circuit "HC" can be omitted.

As described above, the logic circuit "F" controls the load switch element "SW" by using the signal "SSW" based on the comparison result signal "SO" and the load control signal "SF".

As shown in FIG. 1, for example, the logic circuit "F" includes an inverter "F2" that is connected to the output of the comparator "COMP" at an input thereof and receives the comparison result signal "SO", and an AND circuit "F1" that receives an output signal of the inverter "F2" and the load control signal "SF", performs logical OR operation of the output signal of the inverter "F2" and the load control signal "SF" and outputs the resulting signal as the signal "SSW" for controlling the load switch element "SW".

The logical circuit "F" turns off the load switch element "SW" by using the signal "SSW", if the comparison result signal "SO" indicates that the detection voltage "VZ" is equal to or higher than the threshold voltage "VZ" (that is, the load "Load" is short-circuited) when the load control signal "SF" indicates to drive the load "Load".

Thus, when the load "Load" is short-circuited, the load switch element "SW" can be safely turned off and protected.

On the other hand, the logical circuit "F" turns on the load switch element "SW" by using the signal "SSW", if the comparison result signal "SO" indicates that the detection voltage "VZ" is lower than the threshold voltage "VZ" (that is, the load "Load" is not short-circuited) when the load control signal "SF" indicates to drive the load "Load".

Thus, the load "Load" can be driven in the state where the load "Load" is not short-circuited.

When the load control signal "SF" indicates to stop the operation of the load "Load", the logical circuit "F" turns off the load switch element "SW".

In this way, the operation of the load "Load" can be stopped.

Next, an example of an operation of the load driver circuit 100 configured as described above will be described with reference to FIG. 2.

Figure 2:
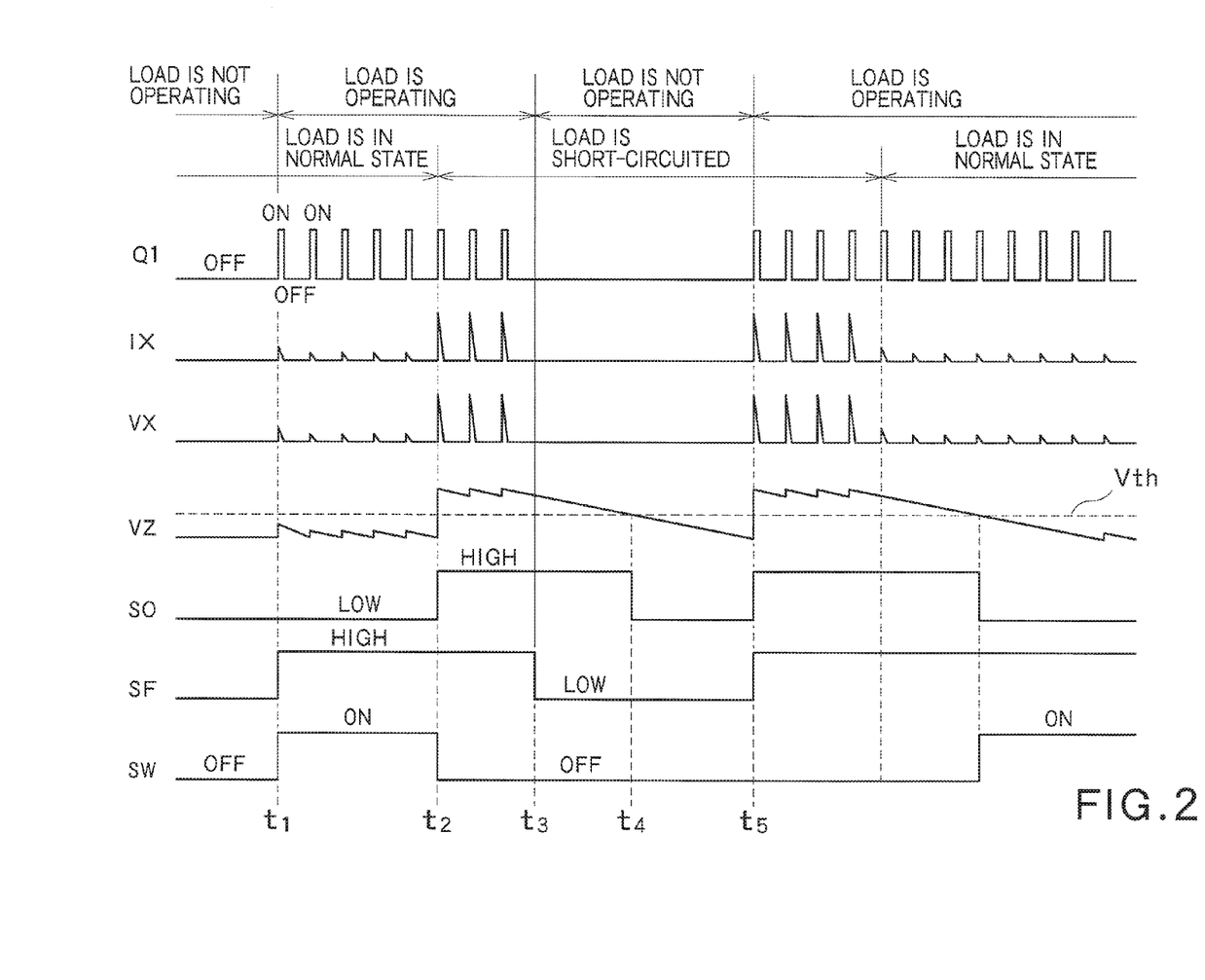
FIG. 2 is a waveform diagram showing an example of operation waveforms of a load driver circuit 100 shown in FIG. 1.

At a time preceding a time "t1" in FIG. 2, the control circuit "CON" outputs a load control signal "SF" at a "Low" level to stop the operation of the load "Load" in response to an external command, for example. Since the load control signal "SF" indicates to stop the operation of the load "Load", the logic circuit "F" turns off the load switch element "SW".

At this time, the control circuit "CON" controls the first switch element "Q1" to be in the off state (that is, stops the current detection operation of the detection circuit "DC").

Then, at the time "t1", the control circuit "CON" sets the load control signal "SF" at a "High" level to drive the load "Load" in response to an external command, for example.

Furthermore, the control circuit "CON" starts periodically switching the first switch element "Q1" in the detection circuit (that is, starts the current detection operation in the detection circuit "DC").

For example, if the first switch element "Q1" is turned on at the time "t1", the current "IX" flows to the detection capacitor "CX", and the detection capacitor "CX" is charged. As a result, the voltage "VX" between the opposite ends of the detection resistor "RX" (the voltage of the detection signal "SX") increases.

The current "IX" that flows when the load "Load" is in the normal state (that is, when the load "Load" is not short-circuited) is smaller than the current "IX" that flows when the load "Load" is short-circuited. Therefore, the increase of the voltage "VX" between the opposite ends of the detection resistor "RX" in the case where the load "Load" is not short-circuited is also smaller than the increase of the voltage "VX" in the case where the load "Load" is short-circuited.

The peak hold circuit "HC" holds the peak of the voltage "VX" between the opposite ends of the detection resistor "RX" and outputs the held peak voltage as the detection voltage "VZ" at the second node "N2".

When the load "Load" is not short-circuited, the voltage "VZ" between the opposite ends of the holding capacitor "CZ" is reduced, since the current "IX" flowing to the detection capacitor "CX" is low.

The comparison circuit "CC" compares the detection voltage "VZ" with the threshold voltage "Vth", and outputs the comparison result signal "SO" at the "Low" level when the detection voltage "VZ" is lower than the threshold voltage "Vth" (from the time "t1" to a time "t2").

Thus, from the time "t1" to the time "t2", since the load control signal "SF" indicates to drive the load "Load" (that is, the load control signal "SF" is at the "High" level), and the comparison result signal "SO" indicates that the detection voltage "VZ" is lower than the threshold voltage (that is, the comparison result signal "SO" is at the "Low" level), the logic circuit "F" keeps the load switch element "SW" in the on state by using the signal "SSW".

Then, at the time "t2", the load "Load" is short-circuited.

At this time, the control circuit "CON" sets the load control signal "SF" at the "High" level to drive the load "Load" in response to an external command and periodically switches the first switch element "Q1" in the detection circuit "DC".

For example, if the first switch element "Q1" is turned on at the time "t2", the current "IX" flows to the detection capacitor "CX", and the detection capacitor "CX" is charged. At this time, the voltage "VX" between the opposite ends of the detection resistor "RX" (the voltage of the detection signal "SX") increases because of an inrush current to the detection capacitor "CX".

The peak hold circuit "HC" holds the peak of the voltage "VX" between the opposite ends of the detection resistor "RX" and outputs the held peak voltage as the detection voltage "VZ" at the second node "N2".

When the load "Load" is short-circuited, the voltage "VZ" between the opposite ends of the holding capacitor "CZ" is approximately equal to the voltage of the battery "B".

The comparison circuit "CC" compares the detection voltage "VZ" with the threshold voltage "Vth", and outputs the comparison result signal "SO" at the "High" level, since the detection voltage "VZ" is equal to or higher than the threshold voltage "Vth" (from the time "t2" to a time "t3").

Thus, from the time "t2" to a time "t4", since the load control signal "SF" indicates to drive the load "Load" (that is, the load control signal "SF" is at the "High" level), and the comparison result signal "SO" indicates that the detection voltage "VZ" is equal to or higher than the threshold voltage (that is, the comparison result signal "SO" is at the "High" level), the logic circuit "F" keeps the load switch element "SW" in the off state by using the signal "SSW".

Since the short-circuit state of the load "Load" is detected, and the load switch element "SW" is in the off state, an overcurrent can be prevented from flowing to the load switch element "SW".

At the time "t3", the control circuit "CON" sets the load control signal "SF" at the "Low" level to stop the operation of the load "Load" in response to an external command, for example.

Since the load control signal "SF" indicates to stop the operation of the load "Load", the logic circuit "F" maintains the load switch element "SW" in the off state.

At this time, the control circuit "CON" turns off the first switch element "Q1" (that is, stops the current detection operation of the detection circuit "DC").

As a result, the detection capacitor "CX" is discharged, and the detection voltage "VZ" decreases.

Then, when the detection voltage "VZ" becomes lower than the threshold voltage "Vth", the comparison circuit "CC" sets the comparison result signal "SO" at the "Low" level (at the time "t4").

Then, at a time "t5", the control circuit "CON" sets the load control signal "SF" at the "High" level to drive the load "Load" in response to an external command, for example.

Furthermore, the control circuit "CON" starts periodically switching the first switch element "Q1" in the detection circuit "DC" (that is, starts the current detection operation of the detection circuit "DC").

If the first switch element "Q1" is turned on at the time "t5", the current "IX" flows to the detection capacitor "CX", and the detection capacitor "CX" is charged. As a result, the voltage "VX" between the opposite ends of the detection resistor "RX" (the voltage of the detection signal "SX") increases.

The peak hold circuit "HC" holds the peak of the voltage "VX" between the opposite ends of the detection resistor "RX" and outputs the held peak voltage as the detection voltage "VX" at the second node "N2".

Since the load "Load" is in the short-circuit state, the voltage "VZ" between the opposite ends of the holding capacitor "CZ" is approximately equal to the voltage of the battery "B".

The comparison circuit "CC" compares the detection voltage "VZ" with the threshold voltage "Vth", and outputs the comparison result signal "SO" at the "High" level, since the detection voltage "VZ" is equal to or higher than the threshold voltage "Vth" (from the time "t5" onward).

At the time "t5", since the load control signal "SF" indicates to drive the load "Load" (that is, the load control signal "SF" is at the "High" level), and the comparison result signal "SO" indicates that the detection voltage "VZ" is equal to or higher than the threshold voltage (that is, the comparison result signal "SO" is at the "High" level), the logic circuit "F" keeps the load switch element "SW" in the off state by using the signal "SSW".

In this way, even when the load switch element "SW" for driving the load "Load" is in the off state (that is, the load "Load" is not operating), the short-circuit state of the load "Load" is detected, and the load switch element is in the off state (that is, the load switch element is prevented from being turned on). That is, the load switch element can be safely turned off.

The control circuit "CON" preferably outputs the load control signal "SF" to drive the load "Load" after starting periodically switching the first switch element "Q1" in the detection circuit "DC" (that is, after starting the current detection operation of the detection circuit "DC"). In the example shown in FIG. 2, the pulse signal for controlling the first switch element "Q1" is preferably output approximately several milliseconds after the load control signal "SF" at the "High" level is output.

In this way, the short circuit of the load "Load" can be detected with higher reliability.

As described above, a load driver circuit according to an aspect of the present invention is a load driver circuit that controls driving of a load, and the load driver circuit includes: a first terminal to which the load is connected at one end thereof; a second terminal to which a battery is connected at a negative electrode thereof, the battery being connected to another end of the load at a positive electrode thereof; a load switch element that has a current path connected to the first terminal at one end thereof and to the second terminal at another end thereof, the load switch element being turned on to supply a current from the battery to the load to drive the load and turned off to interrupt the supply of the current to the load to stop the operation of the load; a detection circuit that periodically detects a current flowing to the first terminal and outputs a detection signal responsive to a result of the detection at a first node; a comparison circuit that compares a detection voltage responsive to the detection signal with a threshold voltage and outputs a comparison result signal responsive to a result of the comparison; a control circuit that controls the current detection operation of the detection circuit and outputs a load control signal that controls the operation of the load; and a logic circuit that controls the load switch element based on the comparison result signal and the load control signal.

When the load control signal indicates to drive the load, if the comparison result signal indicates that the detection voltage is equal to or higher than the threshold, the logic circuit determines that the load is short-circuited, and turns off the load switch element.

On the other hand, when the load control signal indicates to drive the load, if the comparison result signal indicates that the detection voltage is lower than the threshold, the logic circuit determines that the load is not short-circuited, and turns on the load switch element.

In this way, even when the load switch element for driving the load is in the off state (that is, when the load is not operating), the short-circuit state of the load can be detected. If the short-circuit state of the load is detected, the load switch element is turned off (or prevented from being turned on). Therefore, an overcurrent can be prevented from flowing to the load switch element.

That is, the load driver circuit according to the present invention can detect the short-circuit state of the load and protect the switch element with higher reliability.

Second Embodiment

Figure 3:
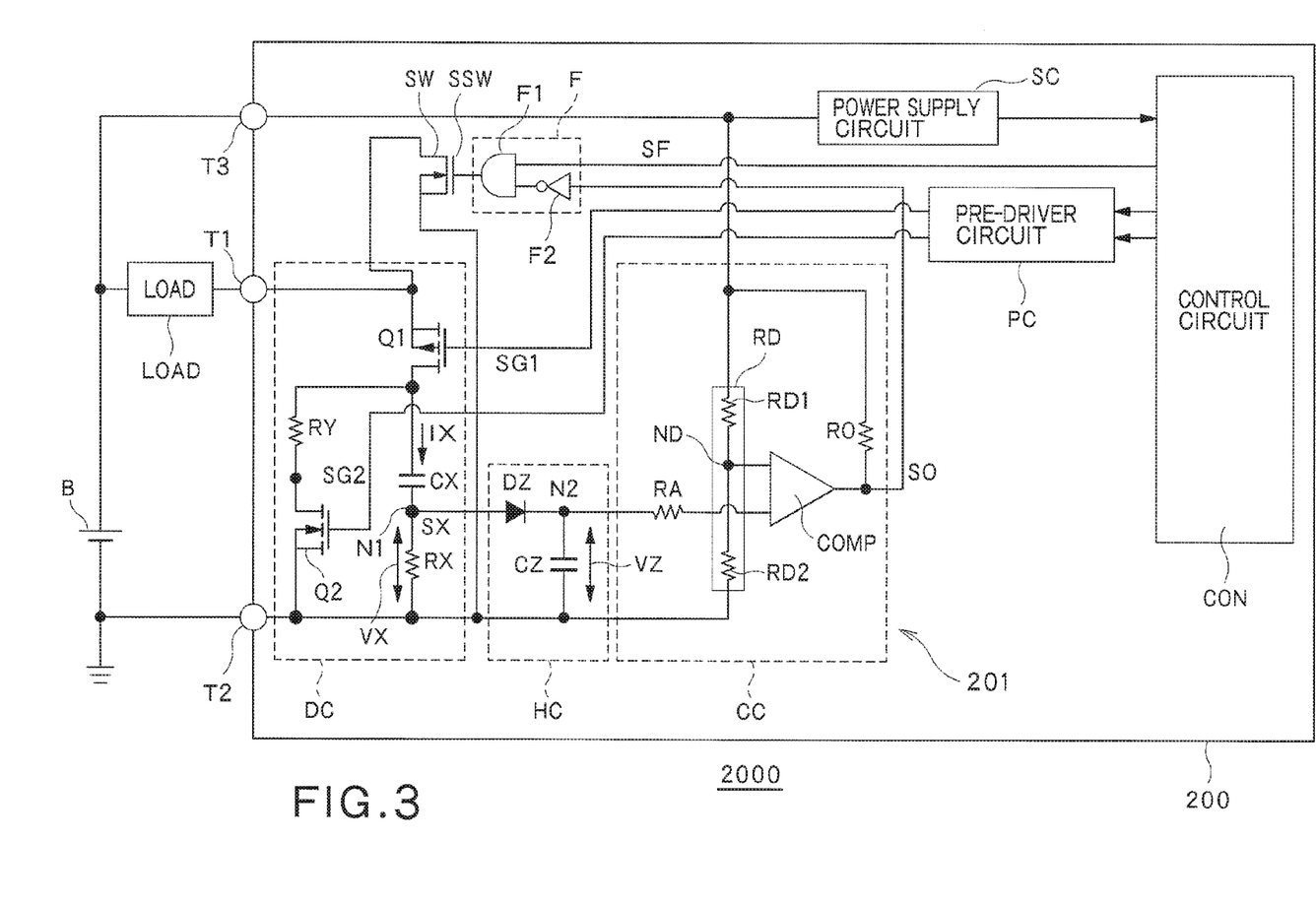
FIG. 3 is a diagram showing an example of a configuration of a load driver system 2000 according to a second embodiment.

An example of a configuration of a load driver circuit according to a second embodiment, which differs from the load driver circuit according to the first embodiment in the configuration of the detection circuit, will be described. FIG. 3 is a circuit diagram showing an example of a configuration of a load driver system 2000 according to the second embodiment. In FIG. 3, the same reference symbols as those in FIG. 1 denote the same components as those in the first embodiment, and redundant descriptions thereof will be omitted.

The load driver system 2000 (FIG. 3) according to the second embodiment includes the battery "B", the load "Load" connected to the battery "B", and an load driver circuit 200 that controls driving of the load "Load".

The load driver circuit 200 according to the second embodiment differs from the load driver circuit 100 according to the first embodiment in the configuration of the detection circuit "DC".

The detection circuit "DC" includes the first switch element "Q1" that is connected to the first terminal "T1" at one end thereof and is turned on and off under the control of the control circuit "CON", the detection capacitor "CX" that is connected to another end of the first switch element "Q1" at one end thereof and to the first node "N1" at another end thereof, the detection resistor "RX" that is connected to the first node "N1" at one end thereof and to the second terminal "T2" at another end thereof, the discharge resistor "RY" that is connected to the another end of the first switch element "Q1" at one end thereof and to the second terminal "T2" at another end thereof, and a second switch element "Q2" that is connected in series with the discharge resistor "RY" between the another end of the first switch element "Q1" and the second terminal "T2".

In short, this detection circuit "DC" differs from the detection circuit "DC" in the first embodiment in that the detection circuit "DC" further includes the second switch element "Q2". In the example shown in FIG. 3, the second switch element "Q2" is an nMOS transistor that is connected in series with the discharge resistor "RY" between the another end of the first switch element "Q1" and the second terminal "T2" and has a gate voltage controlled by the control circuit "CON".

When the control circuit "CON" turns on the first switch element "Q1" by using the first gate signal "SG1", the control circuit "CON" turns off the second switch element "Q2" by using a second gate signal "SG2" via the pre-driver circuit "PC", for example.

On the other hand, when the control circuit "CON" turns off the first switch element "Q1" by using the first gate signal "SG1", the control circuit "CON" turns on the second switch element "Q2" by using the second gate signal "SG2" via the pre-driver circuit "PC".

As a result of this operation of the second switch element "Q2", the detection capacitor "CX" is discharged only when the first switch element "Q1" is in the off state. Thus, the efficiency of charging and discharging of the detection capacitor "CX" can be improved.

The remainder of the configuration of the load driver circuit 200 is the same as that of the load driver circuit 100 shown in FIG. 1.

The remainder of the operational characteristics of the load driver circuit 200 configured as described above is the same as that of the load driver circuit 100 according to the first embodiment.

That is, as with the load driver circuit according to the first embodiment, the load driver circuit according to the second embodiment can detect the short-circuit state of the load and protect the switch element(s) with higher reliability.

Although embodiments of the present invention have been described, these embodiments are shown as examples and are not intended to limit the scope of the present invention. These embodiments can be implemented in other various forms, and various omissions, replacements or modifications are possible without departing from the spirit of the present invention. These embodiments and modifications thereof are included in the scope and spirit of the present invention and are included in the scope of the present invention set forth in the claims and equivalents thereof.

The invention claimed is:

1. A load driver circuit that controls driving of a load, comprising:
    a first terminal to which the load is connected at one end thereof;
    a second terminal to which a battery is connected at a negative electrode thereof, the battery being connected to another end of the load at a positive electrode thereof;
    a load switch element that has a current path connected to the first terminal at one end thereof and to the second terminal at another end thereof, the load switch element being turned on to supply a current from the battery to the load to drive the load and turned off to interrupt the supply of the current to the load to stop the operation of the load;
    a detection circuit comprising a first switch element connected to the first terminal at one end thereof, a detection capacitor connected to another end of the first switch element at one end thereof and to a first node at another end thereof, a detection resistor connected to the first node at one end thereof and to the second terminal at another end thereof, and a discharge resistor connected in parallel with the detection resistor and the detection capacitor between the another end of the first switch element and the second terminal, the discharge resistor being connected to the another end of the first switch element at one end thereof and to the second terminal at another end thereof, the detection circuit periodically detecting an inrush current that flows to the detection capacitor from the first terminal through the first switch element and outputting a detection signal responsive to a result of the detection at the first node;
    a peak hold circuit that holds a peak voltage of the detection signal and outputs the held peak voltage as a detection voltage;
    a comparison circuit that compares the detection voltage with a threshold voltage and outputs a comparison result signal responsive to a result of the comparison;
    a control circuit that controls the first switch element to switch on and off, controls a current detection operation of the detection circuit, and outputs a load control signal that controls the operation of the load; and
    a logic circuit that controls the load switch element based on the comparison result signal and the load control signal,
    wherein, when the load control signal indicates to drive the load,
    the logic circuit turns off the load switch element when the comparison result signal indicates that the detection voltage is equal to or higher than the threshold voltage, and
    turns on the load switch element when the comparison result signal indicates that the detection voltage is lower than the threshold voltage.

2. The load driver circuit according to claim 1, wherein when the load control signal indicates to stop the operation of the load,
    the logic circuit
    turns off the load switch element.

3. The load driver circuit according to claim 1, wherein the control circuit
    controls the first switch element to periodically switch on and off, and
    the detection circuit
    outputs the detection signal at the first node.

4. The load driver circuit according to claim 3, wherein the detection circuit further comprises:
    a second switch element connected in series with the discharge resistor between the another end of the first switch element and the second terminal, and
    the control circuit
    controls the second switch element to switch off when the control circuit turns on the first switch element, and
    controls the second switch element to switch on when the control circuit turns off the first switch element.

5. The load driver circuit according to claim 3, wherein the peak hold circuit outputs the held peak voltage as the detection voltage at the second node.

6. The load driver circuit according to claim 5, wherein the peak hold circuit comprises:
    a holding diode that is connected to the first node at an anode thereof and to the second node at a cathode thereof; and
    a holding capacitor that is connected between the second node and the second terminal.

7. The load driver circuit according to claim 6, wherein the comparison circuit comprises:

a voltage divider circuit that outputs a divided voltage as the threshold voltage, the divided voltage being obtained by dividing a voltage between the third terminal and the second terminal; and a comparator that receives the detection voltage and the threshold voltage, compares the detection voltage with the threshold voltage, and outputs the comparison result signal in response to a result of the comparison.

8. The load driver circuit according to claim 7, wherein the voltage divider circuit comprises:

a first voltage divider resistor that is connected to the third terminal at one end thereof and to a voltage dividing node at another end thereof; and a second voltage divider resistor that is connected to the voltage dividing node at one end thereof and to the second terminal at another end thereof, and the voltage divider circuit outputs a voltage at the voltage dividing node as the threshold voltage.

9. The load driver circuit according to claim 5, wherein the threshold voltage is set to be lower than the detection voltage, which is the peak voltage of the detection signal that is output from the detection circuit as a result of the control circuit periodically turning on and off the first switch element, in a state where the load is short-circuited.

10. The load driver circuit according to claim 9, wherein the threshold voltage is set to be higher than the detection voltage, which is the peak voltage of the detection signal that is output from the detection circuit as a result of the control circuit periodically turning on and off the first switch element, in a state where the load is not short-circuited.

11. The load driver circuit according to claim 7, wherein the logic circuit comprises:

an inverter that is connected to an output of the comparator at an input thereof and receives the comparison result signal; and an AND circuit that receives an output signal of the inverter and the load control signal and outputs, as a signal that controls the load switch element, a signal obtained by logical OR operation of the output signal of the inverter and the load control signal.

12. The load driver circuit according to claim 1, wherein the load is a servomotor, a solenoid, a lamp or a heater.

13. The load driver circuit according to claim 6, wherein the detection capacitor has a capacitance greater than a capacitance of the holding capacitor.

14. The load driver circuit according to claim 2, wherein the first switch element is a pMOS transistor that is connected to the first terminal at a source thereof and to the one end of the detection capacitor at a drain thereof and has a gate voltage controlled by the control circuit.

15. A load short-circuit detection circuit that detects a short-circuit state of a load, comprising:

a first terminal to which the load is connected at one end thereof;

a second terminal to which a battery is connected at a negative electrode thereof, the battery being connected to another end of the load at a positive electrode thereof;

a load switch element that has a current path connected to the first terminal at one end thereof and to the second terminal at another end thereof, the load switch element being turned on to supply a current from the battery to the load to drive the load and turned off to interrupt the supply of the current to the load to stop the operation of the load;

a detection circuit comprising a first switch element connected to the first terminal at one end thereof, a detection capacitor connected to another end of the first switch element at one end thereof and to a first node at another end thereof, a detection resistor connected to the first node at one end thereof and to the second terminal at another end thereof, and a discharge resistor connected in parallel with the detection resistor and the detection capacitor between the another end of the first switch element and the second terminal, the discharge resistor being connected to the another end of the first switch element at one end thereof and to the second terminal at another end thereof, the detection circuit periodically detecting an inrush current that flows to the detection capacitor from the first terminal through the first switch element and outputting a detection signal responsive to a result of the detection at the first node;

a peak hold circuit that holds a peak voltage of the detection signal and outputs the held peak voltage as a detection voltage; and a comparison circuit that compares the detection voltage with a threshold voltage and outputs a comparison result signal responsive to a result of the comparison.

* * * * *